United States Patent [19]

Okoren

[11] Patent Number: 5,009,075
[45] Date of Patent: Apr. 23, 1991

[54] FAULT DETERMINATION TEST METHOD FOR SYSTEMS INCLUDING AN ELECTRONIC EXPANSION VALVE AND ELECTRONIC CONTROLLER

[75] Inventor: Ronald W. Okoren, Holmen, Wis.

[73] Assignee: American Standard Inc., New York, N.Y.

[21] Appl. No.: 511,706

[22] Filed: Apr. 20, 1990

[51] Int. Cl.⁵ .............................................. G01M 19/00
[52] U.S. Cl. .................................... 62/127; 73/168; 137/554; 318/490; 324/158 MG
[58] Field of Search ................ 137/554 X; 73/168 X; 324/158 MG X, 546; 318/490 X; 62/127

[56] References Cited

U.S. PATENT DOCUMENTS

| | | |
|---|---|---|
| 4,420,040 | 12/1983 | Raider et al. .............. 324/158 MG |
| 4,528,493 | 7/1985 | Spencer et al. ............. 324/158 MG |
| 4,694,390 | 9/1987 | Lee .................................. 137/554 X |
| 4,730,164 | 3/1988 | Daido et al. ............ 324/158 MG X |

*Primary Examiner*—William E. Wayner
*Attorney, Agent, or Firm*—William J. Beres; William O'Driscoll; David L. Polsley

[57] ABSTRACT

In a system for refrigeration and air conditioning including a microprocessor based electronic controller and an electronic expansion valve responsive to the controller, a fault determination test method for discovering operational faults in the controller and the valve. The test method further determines whether the failure is due to the valve or the controller to minimize servicing time by providing test results applicable to a logic table which indicates the failed component and the action to be taken by the service technician.

9 Claims, 8 Drawing Sheets

FAULT DETERMINATION TEST METHOD FOR SYSTEMS INCLUDING AN ELECTRONIC EXPANSION VALVE AND ELECTRONIC CONTROLLER

DESCRIPTION

1. Technical Field

This invention pertains generally to refrigeration and air conditioning systems and particularly to fault determination and test methods for refrigeration and air conditioning systems having an electronic expansion valve operated by a microprocessor based electronic controller.

2. Background Art

In typical refrigeration and air conditioning systems utilizing an expansion valve for control of refrigerant, the expansion valve has typically been a thermostatic type mechanical valve, directly responsive to a sensed refrigerant condition such as pressure or temperature at one point in the system. Such valves are often not tested on any regular basis, but rather are simply replaced in the event of catastrophic or complete failure. In cases where testing is performed, usually only the complete system performance is tested, with the operation of the valve being tested separately where the system performance does not meet acceptable criterion. This has typically been necessary since the typical valves does not lend itself to testing of operational status while in situ. Therefore, the valve may be replaced where failure is only suspected rather than known.

More recently, electronic expansion valve have been developed. While there are several types, the most common are the pulse type and the incremental or stepper motor driven sliding gate type. These valves are typically operated by an electronic controller which may be responsive not only to the refrigerant condition at one or more locations in the system but also to other criteria such as time lapse or ambient conditions. This has made the testing of electronic expansion valves and their controllers both more important and more difficult than in the case of thermostatic expansion valves.

Since the valve is operated by the controller in response to a variety of conditions and criteria, it is difficult to test the system performance at any given time without accounting for such criteria as noted above. Even when these factors are considered, it must be noted that the system performance is dependent upon proper and accurate operation and interaction of the valve, the controller, and the various sensors in the system. Therefore, a test procedure which is limited to indicating simple degradation of system performance does not always indicate or suggest the failing or faulty component. It is desirable to test at least some of the system components in such a manner as will clearly indicate the operational status thereof and eliminate the need for guesswork and unnecessary piecemeal replacement.

Therefore, it is an object of the invention to provide a test procedure which will indicate accurately the performance and operational status of a stepper motor driven incremental electronic expansion valve.

It is another object of the invention to provide such a test procedure as will be expedient as well as accurate.

It is yet another object of the invention to provide a test procedure and method as will permit both scheduled and on-demand testing of the electronic expansion valve and the controller without requiring disassembly of the system in which the valve and controller are installed.

Finally, it is an object of the invention to provide such a test method as will be easily and inexpensively implemented.

These and other objects of the present invention will be apparent from the attached drawings and the description of the preferred embodiment that follows hereinbelow.

SUMMARY OF THE INVENTION

The subject invention comprises a test method for testing the performance and operational status of a stepper motor driven electronic expansion valve and a microprocessor driven electronic controller for the valve in systems for refrigeration and air conditioning applications. The preferred test procedure requires a power supply of known repeatable impedance and a valve which has an audible indication of mechanical end of stroke and a three phase stepper motor.

The preferred test procedure includes several subdivisions. The first division of the test proves the electrical integrity of the valve and controller by setting the valve and drive circuitry to the "off" condition and sampling the voltage of the individual drive circuitry for each of the three phases in this condition. Each individual drive circuit is then set to the "on" condition, in which the voltage of each drive circuit is again sampled. An electrical fault, or FAIL condition, is indicated when any of the sampled voltages exceed predetermined limits. The first test division is performed automatically by the microprocessor prior to valve operation, and is available on-demand to service personnel.

The second division of the test is a timing test for determining proper operation of the valve. The timing test is conducted by directing the valve to the completely closed position for a specified duration, and then immediately directing the valve to the completely open position for a specified duration. When the valve reaches the completely closed position, the end of stroke will be audibly indicated. Likewise, the valve will audibly indicate reaching the completely open position. By timing the duration between the audibly indicated completely closed and completely open positions, the stroke time of the valve will be known. Should the stroke time exceed predetermined limits, the FAIL condition will be noted.

The third division of the test procedure is a motor winding resistance check in the event the stroke timing test is failed. This prevents unnecessary replacement of the valve in the event that the connecting wiring between the controller and the valve is faulty rather than the electrical components of the valve itself.

BRIEF DESCRIPTION OF THE DRAWINGS

FIG. 2 shows in greater detail an exemplary electronic controller in which the subject invention may be applied.

DESCRIPTION OF THE PREFERRED EMBODIMENT

Figure 1:
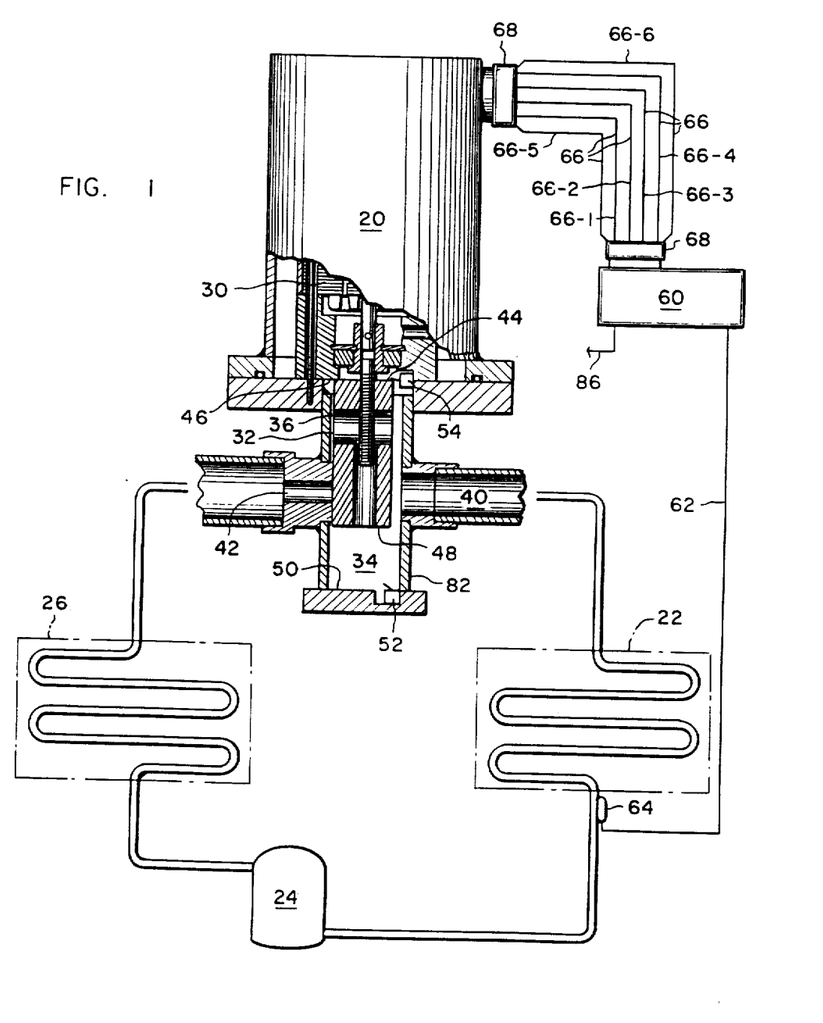
FIG. 1 depicts in schematic a refrigeration system including a stepper motor driven expansion valve and electronic controller in which the subject invention may be suitably employed.

A refrigeration system embodying the subject invention is generally shown in FIG. 1 and referred to by the reference numeral 10. It will be appreciated by those skilled in the art that the refrigeration system 10 as suitably modified, is applicable to a wide variety of refrigeration and air conditioning applications.

The refrigeration system 10, as shown in schematic form in FIG. 1, is comprised of a variable flow rate expansion valve 20 for providing a controlled flow rate and expansion of the refrigerant, an evaporator 22 in flow connection with the valve 20 for gasifying the expanded refrigerant, a compressor 24 in flow connection with the evaporator 22 for receiving and compressing the gasified refrigerant, and a condenser 26 is flow connection with the compressor 24 for receiving and liquefying the refrigerant from the compressor 24. The valve 20 is also in flow connection with the condenser 26 for receiving and controllably expanding the liquefied refrigerant. It is, of course, readily apparent to those skilled in the art that the evaporator 22, the condenser 26 and the compressor 24 could be of any suitable type.

It is believed that the general construction and operation of refrigeration systems are well known to those skilled in the art and need not be explained in detail herein, and therefore no in-depth discussion of the principals of refrigeration system operation need be undertaken herein. The described system is to be understood as exemplary rather than limiting.

The valve 20 includes a three-phase stepper motor 30 which operates a metering piston 32 linearly within a metering chamber 34. The metering 32 piston includes a metering orifice 36 and reciprocates incrementally to permit a regulated flow or to prevent flow through the valve 20 by way of a valve inlet 40, the metering orifice 36 and a valve outlet 42. In the closed position, the valve outlet 42 is covered by the metering piston 32 so that flow is prevented through the valve 20.

The distance or stroke which the metering piston 32 may travel is limited in the closed position by the upper end 44 of the metering piston 32 contacting the upper end 46 of the metering chamber 34, and is limited in the open position by the lower end 48 of the metering piston 32 contacting the lower end 50 of the metering chamber 34.

A controller 60 is connected by a first wiring harness 62 to a sensor 64. The sensor 64 is disposed at the evaporator 22 to determine either the outlet pressure or outlet temperature of the refrigerant from the evaporator 22. A second wiring harness 66 connects the controller 60 to the valve 20 to enable at least the transmission of control signals from the controller 60. The wiring harness 66 includes four wires 66-1. 66-2, 66-3 and 66-4, and connects to the valve 20 and the controller 60 by way of plug connectors 68.

In the preferred embodiment, electrical switches 52 and 54 are provided in the valve 20. These switches 52 and 54 are shown as normally open switches which are closed by contact with the metering piston 32. The switches 52 and 54 are disposed in the valve 20 at or adjacent the full open and full closed positions of the metering piston 32, respectively. Wire 66-5 connects switch 52 to the controller 60 and wire 66-6 connects switch 54 to the controller. This permits the controller to determine the position of the metering piston 32. When the metering piston 32 is in the full open position, switch 52 is activated and a signal is transmitted to the controller 60 through wire 66-5, and when the metering piston 32 is in the full closed position, switch 54 is actuated and a signal is transmitted to the controller 60 through wire 66-6. The wiring of the switches 52 and 54 and the switches 52 and 54 themselves are not shown in detail within the valve 20, but are shown in representative form. It is believed that those skilled in the art will be familiar with the use, wiring and selection of suitable switches.

In an alternative embodiment, a valve 20 having an audible end of stroke is employed. When the metering piston 32 reaches the end of the stroke in either the open or closed position an audible noise is generated. In the event that the stepper motor 30 is operated to cause the metering piston to attempt to exceed the limits of travel, the audible noise continues as a chattering sound. In this alternative embodiment, the wires 66-5 and 66-6 are not provided or necessary. An exemplary valve which is currently commercially available and provides a suitable audible end of stroke signal or noise is the Sporlan Co. series SEO valve for 40 ton and larger rated refrigeration systems.

Turning now to FIG. 2, the exemplary controller 60 is described in more detail. The controller 60 includes a DC power supply 70. This power supply may be regulated, but is preferably unregulated to aid in the taking of measurements according to the method described herein. The power supply connects to the line 66-4 of the wiring harness 66. Motor 30 of the valve 20 preferably includes three windings (not shown) which are common to the line 66-4. Each winding has a separate output to line 66-1, 66-2 or 66-3. These windings are not shown for the reason that stepper motors and phased windings are believed to be well known in the art. Each of the wires 66-1 through 66-3 is connected to a separate drive circuit C1 through C3, respectively. The three drive circuits C1 through C3 are preferably printed circuits installed within the controller 60. Each of the three drive circuits C1 through C3 are preferably identical and are as follows.

The drive circuit C1 contains a drive transistor 74 which is preferably of the mosfet type. The purpose of the drive transistor is to pull the motor 30 winding to which it is connected to ground. Therefore the mosfet 74 is connected to ground as well as to line 66-1. Voltage detection circuitry is provided for detecting the expansion valve switching voltage. This is comprised of a relatively high impedance voltage divider for scaling the voltage, which is preferably a resistor 76 connecting the lines 66-1 to ground. A capacitor 78 which is on the order of .1 microfarad capacitance also connects the lines 66-1 to ground, while a clamping voltage is applied through a diode 80 to insure that the voltage output from the detection circuitry does not exceed a predetermined voltage. The output from the voltage detection circuitry is directed to the analog to digital converter portion of a microprocessor 84 which executes the control function of the controller 60. In normal operation of the valve 20, the output of the detection circuitry is sensed at the analog to digital converter and a signal is provided from the output port of the microprocessor 84 in response to the signal received at the analog to digital converter and the program stored within or acted upon by microprocessor 84. The output signal, which controls the action of the mosfet transistor 74 is applied through connecting line 84.1.

It is believed that no detailed discussion of the operation of the microprocessor 84, the storage of programs or routines therein for execution by the microprocessor 84, the operation of the analog to digital converter, or the other aspects of the operation of the microprocessor 84 need be discussed herein, as they are believed to be well known. It will be appreciated that there are many types of microprocessors which would be suitable to perform the functions of the microprocessor 84 described herein, and that such will be well known to those skilled in the relevant art.

Having described an exemplary refrigeration system 10 including the expansion valve 20 and controller 60, the control methods according to the subject invention is now described in greater detail. In general, the test method may be invoked by a service technician for testing purposes and a portion of the control method is intended to be invoked automatically prior to operation of the expansion valve 20. In order to accomplish the test, the controller 60 turns off the mosfet transistors 74 and samples by way of the analog to digital converters the drain voltages of the mosfet transistor 74 in the off condition. These samples are compared to each other and the controller will indicate that the test has failed if the drain voltages of the mosfet transistor 74 differ by more than 0.3 volts, or if any fall below 2.3 volts. After making this comparison, one mosfet transistor 74 is turned on and the drain voltage of all mosfet transistors 74 of the drive circuits C1 through C3 are again sampled. The voltage of the mosfet transistor 74 which is in the on condition must be less than or equal to 0.1 volts, while that of the mosfet transistors in the off condition must be in the range of 0.4 volts to 1 volt less than the originally sampled value of those mosfets in the off condition. In the event such conditions are not met, the controller 60 once again indicates that the test has been failed. Each mosfet transistor of each drive circuit C1 through C3 is turned on with the others in the off condition and the voltages measured and compared. Where the test is passed, the microprocessor will continue with normal expansion valve operation.

In the event that the test has been failed, the fail condition will have been indicated by the microprocessor 84 through output line 86, which connects to human-readable interface for use by an operator or service technician. A safety mode is also provided which renders the refrigeration system 10 inoperative when the test is failed. Preferably, the safety mode renders only the failed system 10 inoperable in a multiple circuit system including multiple refrigeration systems 10.

According to the preferred embodiment, the microprocessor 84 will continue with a second division of the test procedure. This division is a timing test for the expansion valve 20, to determine whether the expansion valve 20 is functioning within a required mechanical stroke time. In this portion of the procedure, microprocessor 84 determines whether the metering piston 32 is in the closed position by sensing switch 54 through wire 66-6. If the metering piston 32 is not fully closed, the microprocessor activates the valve 20 to this position. Under normal operating conditions, the valve 20 will be in the closed position causing the switch 54 to indicate fully closed. The valve 20 would then be commanded to the full open position, whereupon the microprocessor 84 would receive the indication of full open from switch 52 through wire 66-5. Upon receiving the full open indication from the switch 52, the microprocessor would again command the valve 20 to the full closed position, which would be indicated by the switch 54. The microprocessor 54 would measure the elapsed time between each switch indication to determine whether the valve 20 stroke time falls within minimum and maximum acceptable times.

An exemplary valve operating at 50 steps per second, and having a stroke of 760 steps, a complete stroke would require 15.2 seconds. In the case of the exemplified valve 20, the opening and closing stroke times should fall within plus or minus 2 seconds of the 15.2 seconds noted.

In the alternative embodiment, the microprocessor 84 will determine whether the service technician has entered the test command, and if so, will continue with a second division of the test procedure. In the alternative embodiment, the microprocessor operates the drive circuits C1 through C3 to cause the motor 30 to drive the metering piston 32 to the fully closed position, so that the upper end of the metering piston 44 contacts the upper end of the metering chamber 46. As in the preferred embodiment, the valve 20 will normally be in the closed position causing the valve 20 to generate the audible signal or chatter for the entire duration of the command. For example, where the exemplary valve 20 is commanded to move to the closed position for 1,266 steps, the end of stroke signal would be audible for approximately 25 seconds, at least one and one-half times the expected time normally required to complete a full stroke. Upon the completion of this time period, the controller would then command the valve to the full open position, at which time the end of stroke noise would cease and the service technician would begin timing. The service technician would continue timing until the valve 20 began generating the end of stroke noise in the full open position caused by the metering piston lower end 48 contacting the lower end 50 of the metering chamber 34. Upon the expiration of the time period for the command to full open, the valve would again be commanded to the full closed position by the microprocessor 84, causing the end of stroke noise again to cease until the valve again reached the full closed position. The technician would again preferably time the closing stroke. Where the exemplary valve 20 is employed, a suitable timing duration would be on the order of 25 seconds to ensure that the valve 20 would generate the end of stroke noise for a sufficient duration to permit accurate timing by the service technician.

It will be appreciated by those skilled in the art that the second division of the method can be accomplished equally well either by the controller 60 or by the service technician, depending upon the type of electronic expansion valve 20 utilized, without modification to the method and only slight differences in the actual application of the method.

In the event that the valve 20 fails to fall within the acceptable opening and closing stroke times 20 the fail condition would be indicated for the second portion of the test procedure and the third portion of the test should be undertaken by the service technician. The third portion of the test procedure involves disconnecting the plug 68 from the controller 60 and conducting a winding resistance test across the common wire 66-4 and each of the wires 66-1, 66-2 and 66-3. respectively to determine whether the resistance of the motor windings and wiring harness 66 falls within an acceptable range, an exemplary acceptable range being 36 to 44 ohms where the winding temperature is 75° F. In the event that the resistance is outside the acceptable limits, the fail condition should be noted.

Figure 4:
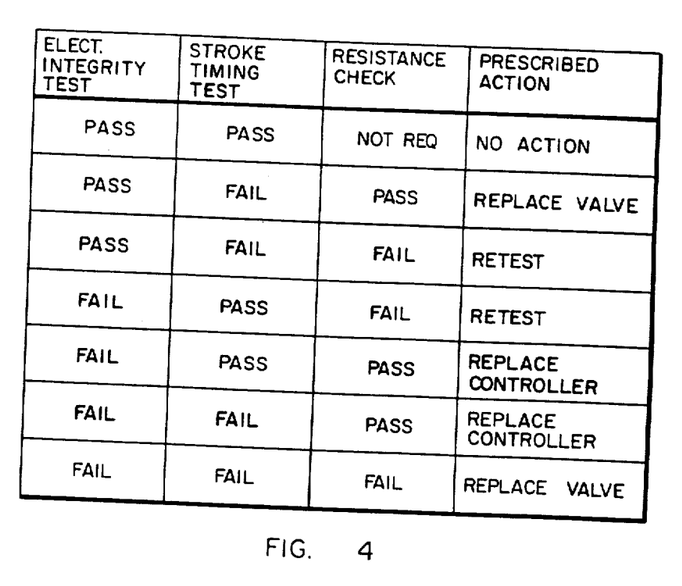
FIG. 4 shows the logic table according to the subject invention.

A logic table is depicted in FIG. 4. The logic table indicates the appropriate action to be taken according to the indication of pass or fail of each of the three divisions of the test procedure. For example, where the first division and second division are in the pass condition, no action is required and the third division of the test is not necessary. Where the first and third divisions of the test procedure are in the pass condition and the second division of the test is in the fail condition, the valve must be replaced. Where the first division of the test is in the pass condition, but both the second and third divisions are fail condition, the printed circuit including the drive circuits C1 through C3 must be replaced. In the event the first division of the test procedure is failed, while the second and third divisions of the test are passed, it is considered necessary to retest since the valve timing test should not be passed if the drive circuits C1 through C3 are functioning improperly. Where the first division and second division of the test are failed with the third division passed the printed circuit containing the drive circuits C1 through C3 must be replaced. In the event all tests are failed, the valve is to be replaced.

Figure 3:
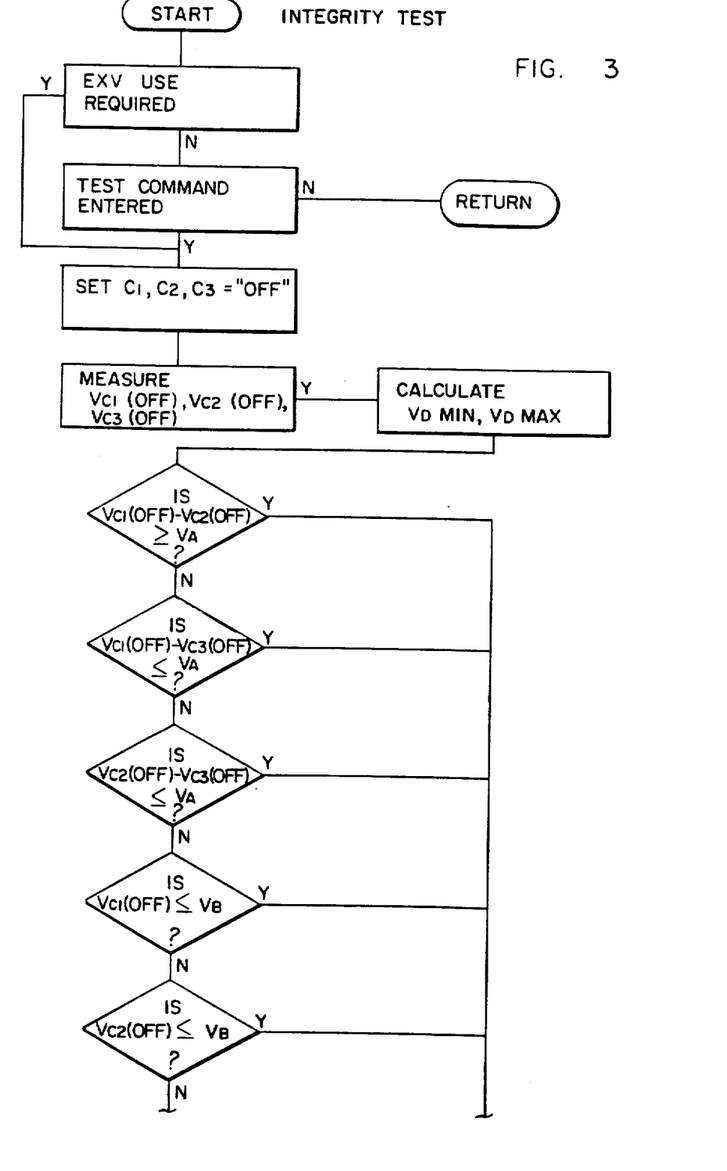
FIG. 3 FIG. 3 (pg,2), FIG. 3 (pg,3), FIG. 3 (pg,4) & FIG. 3 (pg,5) show the method of the subject invention in flow chart form.

The test method according to the subject invention is disclosed in FIG. 3. The microprocessor 84 initiates the test procedure by determining whether expansion valve use is required and if not determining whether the test command was entered and if not, then terminating the procedure. If either is required, the microprocessor 84 sets drive circuits C1, C2 and C3 to the off condition and measures the drain voltage $V_{c1}$ (off) $V_{c2}$ (off) and $V_{c3}$ (off). The next step involves the calculation of the so called droop voltage values $VE_d$. These are the voltage reductions expected to occur in the drive circuits which remain in the off condition when one drive circuit is set to the on condition. In the exemplary refrigeration system 10, the voltage $V_d$ is expected to droop by a minimum voltage $V_{dmin}$ ov 0.4 volts and a maximum droop voltage of $V_{dmax}$ of one volt. Since these are scaled values, it is necessary to calculate and store a $V_{dmin}$ and $V_{dmax}$ for each drive circuit.

For diagnostic purposes the difference of the voltages $V_{c1}$ through $V_{c3}$ are compared. If the difference between any voltages $V_c$ is greater than or equal to a voltage $V_a$ of 0.3 3 volts, the diagnostic condition is flagged, but if not, each voltage $V_c$ (off) is compared to a voltage $V_b$ of 2.3 volts, where the diagnostic condition is flagged if the voltage $V_c$ is less than or equal to the voltage $V_b$. If the diagnostic condition is not flagged during these steps, the drive circuit C1 is set to the on condition and the voltages $V_{c1}$ through $V_{c3}$ are again measured. The voltage $V_{c1}$ must be greater than or equal to a voltage $V_o$ of approximately 0.1 volts. If the voltage exceeds $V_o$, the diagnostic condition is again flagged, but if not the remaining voltages $V_{c2}$ and $V_{c3}$ are compared to their respective $V_{dmin}$ and $V_{dmax}$ voltages. If $V_{c2}$ or $V_{c3}$ do not fall within their acceptable $V_{dmin}$ and $V_{dmax}$ ranges, the diagnostic is again flagged. The drive circuit C1 is then set to the off condition.

The drive circuit C2 and C3 are then in turn set to the on condition with the steps applied to the drive circuit C1 being applied in turn to each of the drive circuits C2 and C3. Upon completion of these measurements and comparison steps, the microprocessor then determines whether the test command was entered and if not, the microprocessor 84 returns to the main program for controlling the refrigeration system. In the event the test command was entered by a service technician, the controller 60 will indicate that the test was passed.

In the event that the diagnostic condition has been flagged by the controller 60 during the aforementioned steps, the test procedure foregoes any of the steps subsequent to the flagging of the diagnostic condition and immediately indicates that the test has been failed. The microprocessor 84 then determines whether the test command was entered and if not returns to the main program and preferably enters the safety mode on the assumption that the expansion valve 20 cannot be properly controlled.

Where the first division of the test has been passed, the test procedure continues with the second division of the test, measurement of the expansion valve stroke time. The microprocessor 84 determines whether the valve 20 is in the full closed position by sensing switch 54, and if it is not, commands the expansion valve 20 to the closed position. Upon receiving the indication from switch 54 that the valve 20 is fully closed, the expansion valve is commanded open and timing is undertaken. Upon receiving the indication from switch 52 that the metering piston 32 is fully open, which is the end of stroke indication, the microprocessor 84 notes the elapsed time and determines whether the time of stroke $T_s$ is within the allowable minimum and maximum limits $T_{smin}$ and $T_{smax}$. In the case of the exemplary expansion valve 20, the minimum stroke time $T_{smin}$ is 13 seconds, while the maximum stroke time $T_{smax}$ is 17 seconds. Where $T_s$ exceeds these limits the test fail is indicated. The expansion valve 20 is commanded to close to permit timing of the closing stroke. Timing is again undertaken and ended on the occurrence of the end of stroke signal from switch 54. Again, the stroke time $T_s$ is compared to the limits $T_{smin}$ and $T_{smax}$ to determine whether the expansion valve 20 has passed or failed the test. At the end of the second division of the test, the result is indicated and the third division of the test is undertaken, as with the preferred embodiment.

The third division of the test consists of checking the resistance across the windings of the motor 30 of the valve 20. This is accomplished by measuring the resistance across each of the wire pairs in the wiring harness 66. It is believed that the actual procedures for measuring resistance across wirings and the instrumentation to accomplish such measurements is well known and widely available to those skilled in the art, and that no in-depth discussion of such procedures is necessary herein, as it is well understood by those skilled in the relevant art.

Upon completion of the three divisions of the test procedure, the indications are compared to those noted in the logic table with the prescribed actions then being taken.

Figure 3A:
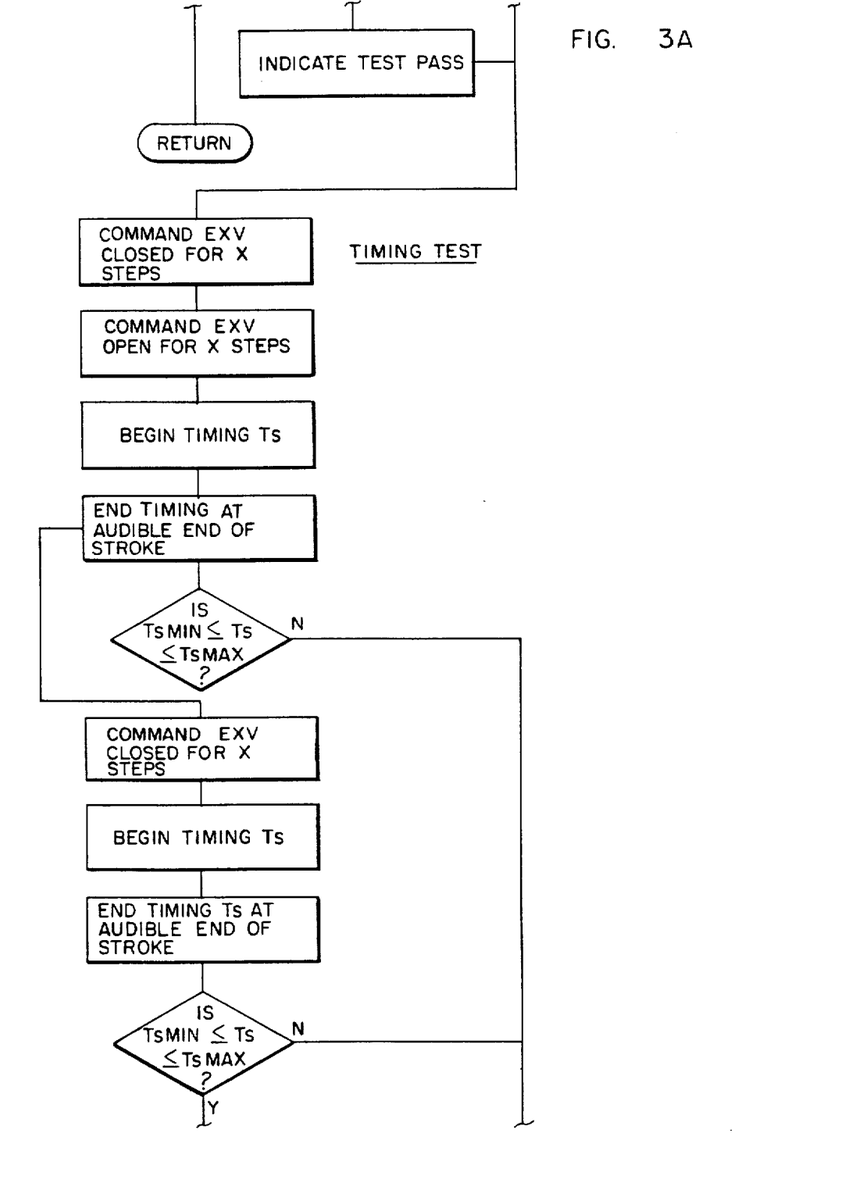
FIG. 3A shows an alternative embodiment of the second division of the method according the subject invention.

In the alternative embodiment of the second division of the test according to FIG. 3A, the test continues if commanded by a service technician. The second division of the test permits timing of the expansion valve by the service technician. The microprocessor 84 commands the expansion valve 20 to the closed position for a certain number of steps, for example, 1,266 steps. The expansion valve is then immediately commanded open for the identical number of steps and timing is undertaken. At the occurrence of the audible end of stroke signal, the service technician notes the elapsed time and determines whether the time of stroke $T_s$ is within the allowable minimum and maximum limits $T_{smin}$ and $T_{smax}$. In the case of the exemplary expansion valve 20, the minimum stroke time $T_{smin}$ is 13 seconds, while the maximum stroke time $T_{smax}$ is 17 seconds. Where $T_s$ exceeds these limits the test fail is indicated. In either event, the expansion valve 20 is commanded to close immediately upon the end of the command open for the same number of steps to permit timing of the closing stroke. Upon the initiation of the command, timing is again undertaken and ended on the occurrence of the audible end of stroke signal. Again, the stroke time $T_s$ is compared to the limits $T_{smin}$ and $T_{smax}$ to determine whether the expansion valve 20 has passed or failed the test. At the end of the second division of the test, the result is indicated and the third division of the test is undertaken, as in the preferred embodiment.

It will be apparent to those skilled in the art that the test procedure according to the subject invention permits easy and accurate servicing of the controller 60 and the expansion valve 20. Furthermore, the test procedure permits on-site testing, which prevents costly and time consuming disassembly of the system 10 in which the expansion valve 20 and controller 60 are employed, making routine testing of the electrical integrity of these system components. Such testing minimizes the chances that expensive and catastrophic failures of the refrigeration system will occur. Finally, it will be apparent that since much of the testing is accomplished within the refrigeration system itself, the equipment requirements for the service technician engaged in routine preventative maintenance will be greatly minimized. Therefore, it can be readily seen that the test procedure according to the subject invention is a substantial improvement over the prior art for testing procedures involving refrigeration systems having electronic expansion valves.

Modification to the preferred embodiment of the subject inventions will be apparent to those skilled in the art within the scope of the claims that follow hereinbelow.

What is claimed is:

1. A method of testing in a refrigeration system an electronic, stepper motor driven expansion valve with an end-of-stroke indication and an electronic controller including a stepper motor drive circuit, said method comprised of:
    setting said drive circuit to an "OFF" condition;
    measuring a voltage $V_C$ in said "OFF" condition;
    comparing said voltage $V_C$ to a predetermined voltage $V_B$;
    indicating a test "FAIL" condition when said voltage $V_C$ is less than said voltage $V_B$; and alternatively
    setting said drive circuit to an "ON" condition;
    measuring said voltage $V_C$ in said "ON" condition;
    comparing said voltage $V_C$ to a predetermined voltage $V_O$;
    indicating a test "FAIL" condition when said voltage $V_C$ is greater than said voltage $V_O$ and indicating a test "PASS" condition when said voltage $V_C$ is greater than said voltage $V_O$.

2. The method as set forth in claim 1 wherein said method comprises the further step of initiating a second division of said test comprised of a timing test of said expansion valve when the "FAIL" condition is indicated.

3. The method as set forth in claim 2 wherein said timing test comprises the further steps of:
    closing said valve for a time duration greater than a time of valve stroke $T_s$;
    opening said valve for said time duration and initiating a time counter;
    terminating said time counter upon the occurrence of said end-of-stroke indication to obtain said time of valve stroke $T_s$;
    closing said valve for said time duration and initiating a time counter;
    terminating said time counter upon the occurrence of said end-of-stroke indication to obtain said time of valve stroke $T_s$;
    comparing said time $T_s$ to an acceptable minimum time of stroke $T_{min}$ and indicating a "FAIL" condition for said second division when said time $T_s$ is less than $T_{min}$;
    comparing said time $T_s$ to an acceptable maximum time of stroke $T_{max}$ and indicating a "FAIL" condition for said second division when said time $T_s$ is greater than $T_{max}$.

4. The method as set forth in claim 3 wherein the method comprises a third division including the further step of measuring the resistance of said valve motor when the "Fail" condition for said second division is indicated.

5. A three division method of testing in a refrigeration system an electronic, stepper motor driven expansion valve with an end-of-stroke indication and an electronic controller including a stepper motor drive circuit, said method comprised of:
    a first division including the steps of;
    setting said drive circuit to an "OFF" condition;
    measuring a voltage $V_C$ in said "OFF" condition;
    comparing said voltage $V_C$ to a predetermined voltage $V_B$;
    indicating a test "FAIL" condition when said voltage $V_C$ is less than said voltage $V_B$; and alternatively
    setting said drive circuit to an "ON" condition;
    measuring said voltage $V_C$ in said "ON" condition;
    comparing said voltage $V_C$ to a predetermined voltage $V_O$;
    indicating a test "FAIL" condition when said voltage $V_C$ is greater than said voltage $V_O$ and indicating a test "PASS" condition when said voltage $V_C$ is greater than said voltage $V_O$;
    initiating said second division when the "FAIL" condition is indicated, said second division comprised of a timing test of said expansion valve; and
    initiating said third division when the "FAIL" condition is indicated for second division, said third division comprised of measuring the resistance of said valve motor.

6. The method as set forth in claim 5 wherein said timing test comprises the further steps of:
    closing said valve for a time duration greater than a time of valve stroke $T_s$,
    opening said valve for said time duration and initiating a time counter;
    terminating said time counter upon the occurrence of said end-of-stroke indication to obtain said time of valve $T_s$;
    closing said valve for said time duration and initiating a time counter;
    terminating said time counter upon the occurrence of said end-of-stroke indication to obtain said time of valve stroke $T_s$;

comparing said time $T_s$ to an acceptable minimum time of stroke $T_{min}$ and indicating a "FAIL" condition for said second division when said time $T_s$ is less than $T_{min}$; and comparing said time $T_s$ to an acceptable maximum time of stroke $T_{max}$ and indicating a "FAIL" condition for said second division when said time $T_s$ is greater than $T_{max}$.

7. A three division method of testing in a refrigeration system an electronic, three-phase stepper motor driven expansion valve with an end-of-stroke indication and an electronic controller including a stepper motor drive circuit for each said phase, said method comprised of:

a first division including the steps of;

setting said drive circuits to an "OFF" condition;

measuring a voltage $V_C$ for each said drive circuit in said "OFF" condition;

calculating and retaining a voltage $V_{Dmin}$ and $V_{Dmax}$ for each said voltage $V_C$;

comparing each said voltage $V_C$ to a predetermined voltage $V_B$;

indicating a test "FAIL" condition when a said voltage $V_C$ is less than said voltage $V_B$; and alternatively;

setting one said drive circuit to an "ON" condition;

measuring a said voltage $V_C$ for each said drive circuit;

comparing said voltage $V_C$ for the drive circuit in the "ON" condition to a predetermined voltage $V_O$;

indicating a test "FAIL" condition when said voltage $V_C$ is greater than said voltage $V_O$ and indicating a test "PASS" condition when said voltage $V_C$ is greater than said voltage $V_O$;

comparing each said voltage $V_C$ for each drive circuit in the "OFF" condition to voltage $V_{Dmin}$ and $V_{Dmax}$ for each said drive circuit;

indicating a "FAIL" condition when $V_C$ is less than $V_{Dmin}$ and indicating a "FAIL" condition when $V_C$ is greater than $V_{Dmax}$;

initiating said second division when the "FAIL" condition is indicated, said second division comprised of a timing test of said expansion valve including the steps of;

closing said valve;

opening said valve and initiating a time counter;

terminating said valve opening and said time counter upon the occurrence of said end-of-stroke indication to obtain said time of valve stroke $T_s$;

closing said valve and initiating a time counter;

terminating said valve closing and said time counter upon the occurrence of said end-of-stroke indication to obtain said time of valve stroke $T_s$;

comparing said time $T_s$ to an acceptable minimum time of stroke $T_{min}$ and indicating a "FAIL" condition for said second division when said time $T_s$ is less than $T_{min}$;

comparing said time $T_s$ to an acceptable maximum time of stroke $T_{max}$ and indicating a "FAIL" condition for said second division when said time $T_s$ is greater than $T_{max}$, and initiating said third division when the "FAIL" condition is indicated for second division, said third division comprised of measuring the resistance of said valve motor.

8. The method as set forth in claim 7 wherein the first division of said method includes the further steps of:

setting all drive circuits to an "OFF" condition;

setting the second of said drive circuits to an "ON" condition;

measuring a said voltage $V_C$ for each said drive circuit;

comparing said voltage $V_C$ for the drive circuit in the "ON" condition to a predetermined voltage $V_O$;

indicating a test "FAIL" condition when said voltage $V_C$ is greater than said voltage $V_O$ and indicating a test when said voltage $V_C$ is greater than said voltage $V_O$;

comparing each said voltage $V_C$ for each drive circuit in the "OFF" condition to voltage $V_{Dmin}$ and $V_{Dmax}$ for each said drive circuit;

indicating a "FAIL" condition when $V_C$ is less than $V_{Dmin}$ and indicating a "FAIL" condition when $V_C$ is greater than $V_{Dmax}$;

setting all drive circuits to an "OFF" condition;

setting the third of said drive circuits to an "ON" condition;

measuring a said voltage $V_C$ for each said drive circuit;

comparing said voltage $V_C$ for the drive circuit in the "ON" condition to a predetermined voltage $V_O$;

indicating a test "FAIL" condition when said voltage $V_C$ is greater than said voltage $V_O$ and indicating a test "PASS" condition when said voltage $V_C$ is greater than said voltage $V_O$;

comparing each said voltage $V_C$ for each drive circuit in the "OFF" condition to voltage $V_{Dmin}$ and $V_{Dmax}$ for each said drive circuit;

indicating a "FAIL" condition when $V_C$ is less than $V_{Dmin}$ and indicating a "FAIL" condition when $V_C$ is greater than $V_{Dmax}$.

9. A method of testing in a refrigeration system an electronic, three-phase stepper motor driven expansion valve with an end-of-stroke indication and an electronic controller including a stepper motor drive circuit for each said phase, said method comprised of:

a first division including the steps of;

setting said drive circuits to an "OFF" condition;

measuring a voltage $V_C$ for each said drive circuit in said "OFF" condition;

calculating and retaining a voltage $V_{Dmin}$ and $V_{Dmax}$ for each said voltage $V_C$;

comparing each said voltage $V_C$ to a predetermined voltage $V_B$;

indicating a test "FAIL" condition when a said voltage $V_C$ is less than said voltage $V_B$; and alternatively;

setting one said drive circuit to an "ON" condition;

measuring a said voltage $V_C$ for each said drive circuit;

comparing said voltage $V_C$ for the drive circuit in the "ON" condition to a predetermined voltage $V_O$;

indicating a test "FAIL" condition when said voltage $V_C$ is greater than said voltage $V_O$ and indicating a test "PASS" condition when said voltage $V_C$ is greater than said voltage $V_O$;

comparing each said voltage $V_C$ for each drive circuit in the "OFF" condition to voltage $V_{Dmin}$ and $V_{Dmax}$ for each said drive circuit;

indicating a "FAIL" condition when $V_C$ is less than $V_{Dmin}$ and indicating a "FAIL" condition when $V_C$ is greater than $V_{Dmax}$;

setting all drive circuits to an "OFF" condition;

setting the second of said drive circuits to an "ON" condition;

measuring a said voltage $V_C$ for each said drive circuit;

comparing said voltage $V_C$ for the drive circuit in the "ON" condition to a predetermined voltage $V_O$;

indicating a test "FAIL" condition when said voltage $V_C$ is greater than said voltage $V_O$ and indicating a test "PASS" condition when said voltage $V_C$ is greater than said voltage $V_O$;

comparing each said voltage $V_C$ for each drive circuit in the "OFF" condition to voltage $V_{Dmin}$ and $V_{Dmax}$ for each said drive circuit;

indicating a "FAIL" condition when $V_C$ is less than $V_{Dmin}$ and indicating a "FAIL" condition when $V_C$ is greater than $V_{Dmax}$;

setting all drive circuits to an "OFF" condition;

setting the third of said drive circuits to an "ON" condition;

measuring a said voltage $V_C$ for each said drive circuit;

comparing said voltage $V_C$ for the drive circuit in the "ON" condition to a predetermined voltage $V_O$;

indicating a test "FAIL" condition when said voltage $V_C$ is greater than said voltage $V_O$ and indicating a test "PASS" condition when said voltage $V_C$ is greater than said voltage $V_O$;

comparing each said voltage $V_C$ for each drive circuit in the "OFF" condition to voltage $V_{Dmin}$ and $V_{Dmax}$ for each said drive circuit;

indicating a "FAIL" condition when $V_C$ is less than $V_{Dmin}$ and indicating a "FAIL" condition when $V_C$ is greater than $V_{Dmax}$;

determining whether said first division was initiated by a test command;

initiating said second division when the "FAIL" condition is indicated and said first division was initiated by said test command, said second division comprised of a timing test of said expansion valve including the steps of;

closing said valve for a time duration greater than a time of valve stroke $T_s$, opening said valve for said time duration and initiating a time counter;

terminating said time counter upon the occurrence of said end-of-stroke indication to obtain said time of valve stroke $T_s$;

closing said valve for said time duration and initiating a time counter;

terminating said time counter upon the occurrence of said end-of-stroke indication to obtain said time of valve stroke $T_s$;

comparing said time $T_s$ to an acceptable minimum time of stroke $T_{min}$ and indicating a "FAIL" condition for said second division when said time $T_s$ is less than $T_{min}$;

comparing said time $T_s$ to an acceptable maximum time of stroke $T_{max}$ and indicating a "FAIL" condition for said second division when said time $T_s$ is greater than $T_{max}$; and initiating said third division when the "FAIL" condition is indicated for second division, said third division comprised of measuring the resistance of said valve motor.

* * * * *

UNITED STATES PATENT AND TRADEMARK OFFICE
CERTIFICATE OF CORRECTION

PATENT NO. : 5,009,075
DATED : April 23, 1991
INVENTOR(S) : Ronald W. Okoren

It is certified that error appears in the above-identified patent and that said Letters Patent is hereby corrected as shown below:

The sheets of drawings should be added as shown on the attatched pages.

Figure 1
    Figure 3 (Page 1)
    Figure 3 (Page 2)
    Figure 3 (Page 3)
    Figure 3 (Page 4)
    Figure 3 (Page 5)
    Figure 3A
    Figure 4

Column 3, line 22, "is" should be --in--.

Column 4, line 36, "30" should be --50--.

Column 7, line 44, "ov" should be --of--.

Column 7, line 51, "0.3 3 volts" should be --0.3 volts--.

Claim 5, Column 10, line 45, "$V_0$and" should be --$V_0$ and--.

Claim 7, Column 11, line 62, "$T_{max}$," should be --$T_{max}$;--.

Claim 8, Column 12, line 9, after the word "test" insert --"PASS" condition--.

Signed and Sealed this

Twenty-seventh Day of October, 1992

Attest:

DOUGLAS B. COMER

Attesting Officer      Acting Commissioner of Patents and Trademarks

| ELECT. INTEGRITY TEST | STROKE TIMING TEST | RESISTANCE CHECK | PRESCRIBED ACTION |
|---|---|---|---|
| PASS | PASS | NOT REQ | NO ACTION |
| PASS | FAIL | PASS | REPLACE VALVE |
| PASS | FAIL | FAIL | RETEST |
| FAIL | PASS | FAIL | RETEST |
| FAIL | PASS | PASS | REPLACE CONTROLLER |
| FAIL | FAIL | PASS | REPLACE CONTROLLER |
| FAIL | FAIL | FAIL | REPLACE VALVE |

FIG. 4